(12) United States Patent
Cave

(10) Patent No.: US 6,313,770 B1
(45) Date of Patent: Nov. 6, 2001

(54) SYSTEM FOR SAMPLING AN ANALOG SIGNAL AND METHOD THEREOF

(75) Inventor: Michael D Cave, Pflugerville, TX (US)

(73) Assignee: Sigmatel, INC, Austin, TX (US)

( * ) Notice: Subject to any disclaimer, the term of this patent is extended or adjusted under 35 U.S.C. 154(b) by 0 days.

(21) Appl. No.: 09/596,152

(22) Filed: Jun. 15, 2000

(51) Int. Cl.[7] .................................... H03M 1/52
(52) U.S. Cl. ................. 341/122; 341/143; 341/172; 341/144; 341/150; 341/120; 341/123; 327/91; 327/341; 327/337; 455/110
(58) Field of Search .................... 341/118, 120, 341/122, 123, 155, 172, 143

(56) References Cited

U.S. PATENT DOCUMENTS

| | | | |
|---|---|---|---|
| 5,418,533 | * 5/1995 | Knferim | 341/122 |
| 5,831,562 | * 11/1998 | Van Auken et al. | 341/122 |
| 5,963,156 | * 10/1999 | Lewicki et al. | 341/122 |
| 6,040,793 | * 3/2000 | Ferguson, Jr. et al. | 341/143 |
| 6,057,791 | * 5/2000 | Knapp | 341/122 |

* cited by examiner

*Primary Examiner*—Peguy Jeanpierre
*Assistant Examiner*—Lam T. Mai
(74) *Attorney, Agent, or Firm*—Timothy W. Markison

(57) ABSTRACT

In accordance with a specific embodiment of the present invention, a system is disclosed having an analog to digital converter and control module. The analog-to-digital converter includes an analog input, digital output, and control input. The control input of the analog-to-digital converter is connected to a pulse width modulated output of the control module which provides an offset pulse width modulated signal. During a first portion of the offset pulse width modulated signal a sampling capacitor is charged. During a second portion of the offset pulse width modulated signal an integration capacitor is charged.

25 Claims, 5 Drawing Sheets

SYSTEM FOR SAMPLING AN ANALOG SIGNAL AND METHOD THEREOF

FIELD OF THE INVENTION

The present invention relates generally to a system and method of sampling analog data, and more specifically to sampling and performing analog-to-digital conversions of analog signals.

BACKGROUND OF THE INVENTION

The demand for digital communications over the Internet has resulted in protocols capable of supporting large bandwidths of data to the consumer. For example, cable and Asynchronous Digital Subscriber Loop (ADSL) modems have the ability to supply data at a rate in upwards of 8 Mbps (Megabits/second). However, the ability to meet these data rates is often limited by the delay and other capabilities of individual systems and their components.

For example, low power systems may be limited by the amount of power dissipation associated with receiving data at such a high rate, while a high performance system may be limited by the sampling rate of its analog components. One a system component which often limits the ability of a system to reach its maximum performance is a receiver front end. A receiver front end is the analog circuitry that converts an analog signal to digital data. Where Complementary Metal Oxide Semiconductor (CMOS) technology is used to implement a receiver front end, the sampling rates of the prior art can limit performance of the receiver front end, and at high data rates the power dissipation is often unacceptable.

Therefore, an A-D converter capable of improving the bandwidth and reducing power dissipation in high-performance communication devices would be useful.

DETAILED DESCRIPTION OF THE DRAWINGS

In accordance with a specific embodiment of the present invention, a system is disclosed having an analog to digital converter and a control module. The analog-to-digital converter includes an analog input, digital output, and control input. The control input of the analog-to-digital converter is connected to a pulse width modulated output of the control module which provides an offset pulse width modulated signal. The present invention is better understood with reference to specific embodiments.

Figure 1:
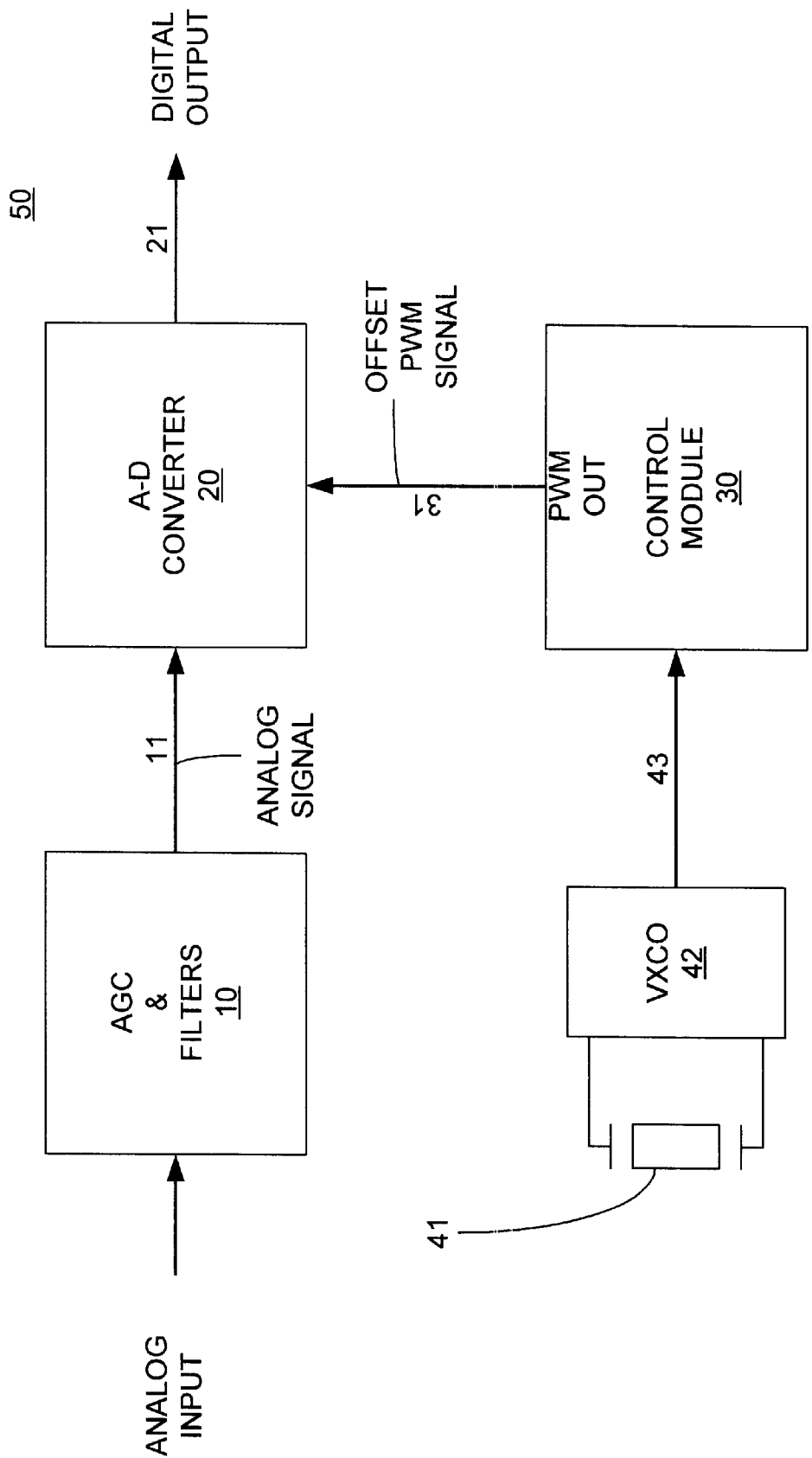
FIG. 1 illustrates, in block diagram form, a receiver front end in accordance with the present invention.

The FIGS. 1 through 10 illustrate specific embodiments of the present invention. Specifically, FIG. 1 illustrates a receiver front end system 50 having an automatic gain control and filters portion 10, A-D converter 20, oscillator 40, and control module 30.

In operation, the automatic gain control and filters portion 10 receives an analog input at an input node. The analog input signal may be any of a various number of signal types including a cable signal, a terrestrial signal, a broadcast signal, or a signal transmitted over a twisted pair wire. The automatic gain control and filters portion 10 achieve a desired gain, attenuation, and filtering of the received analog signal, and provides a conditioned analog signal at an output node which is connected to the node 11. In this manner, a representation of the analog input signal is provided to the A/D converter 20.

An oscillator 40 generates an oscillation signal which is transmitted over the node 43. In a specific embodiment, the oscillator 40 includes a crystal 41, and a voltage controlled oscillator portion 42.

The oscillation signal transmitted on node 43 is received at an input node of the control module 30. The control module 30 provides an offset pulse width modulated signal at an output node labeled PWM OUT, which is connected to node 31 and labeled OFFSET PWM SIGNAL. The OFFSET PWM SIGNAL is considered "offset" because the length of the high state of the PWM signal is significantly different in duration than the low state of the PWM signal. A significantly difference refers to a duty cycle of between 10% and 90%. It will be appreciated that in an alternate embodiment the integration can occur during a low state.

The A-D converter 20 receives the ANALOG SIGNAL from node 11, and the OFFSET PWM SIGNAL from node 31. In response to a first logic level of the OFFSET PWM SIGNAL the A-D converter 20 will sample the analog signal. In response to the second logic level of the OFFSET PWM SIGNAL the analog to digital converter will integrate the sampled signal.

Figure 2:
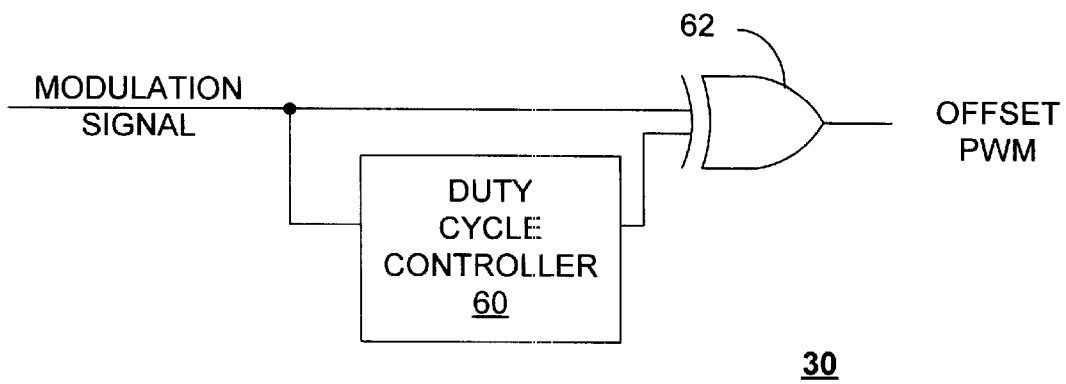
FIG. 2 illustrates, in block diagram form, a portion of the receiver front end of FIG. 1 in greater detail.

FIG. 2 illustrates embodiment of a portion of control module 30 for generating an OFFSET PWM SIGNAL that exhibits low jitter characteristics (below 70 ps RMS). The low jitter obtained by the circuit 30 is due to using the exclusive or gate to open a sampling switch in response to a transition of the modulation signal. As a result of the low jitter characteristic of circuit 30, the jitter error component from the sampling capacitor 76, described herein, is kept below approximately 70 ps RMS. Specifically, FIG. 2 illustrates a MODULATING SIGNAL being received at the first input of an exclusive-or gate 62, and a duty cycle controller 60. The duty cycle controller 60 has an output node which is coupled to the second input of the exclusive-or gate 62. In operation, the modulation signal has a 50% duty cycle and a frequency of ½ the desired offset PWM frequency. The duty cycle controller 60 provides a representation of the modulation signal at its output, where representation of the modulation signal is delayed from the received MODULATION SIGNAL by an offset amount.

Figure 3:
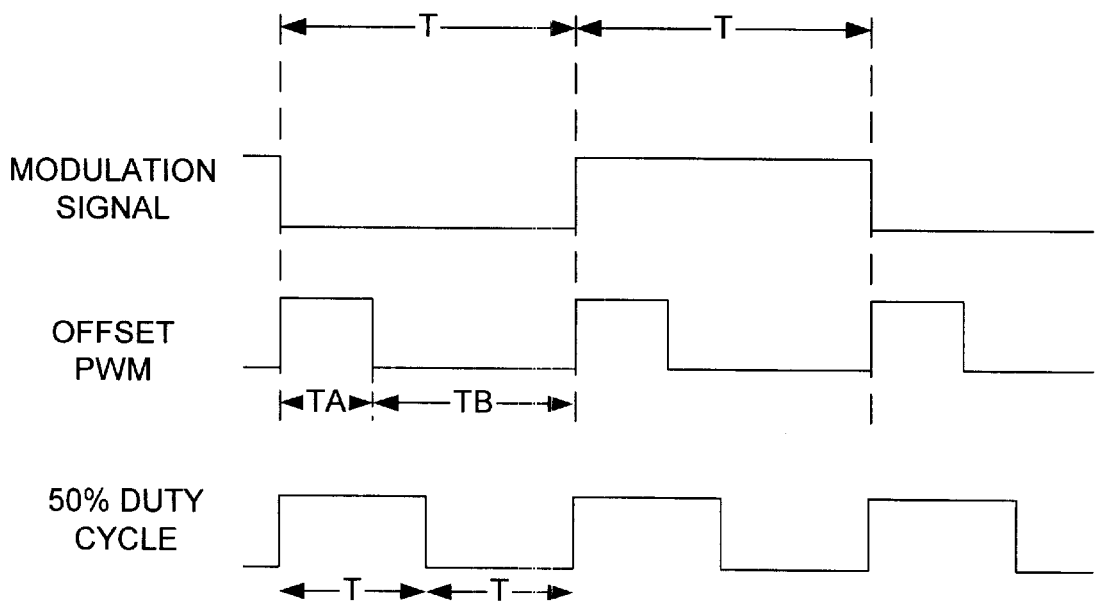
FIG. 3 illustrates, in timing diagram form, timing information in accordance with the present invention.

As result of the delayed modulation signal, the exclusive-or gate 62 will provide a modulated output signal, labeled OFFSET PWM, having a logic level high portion substantially equal in duration to the delay introduced by the duty cycle controller 60, and a frequency substantially equal to twice the frequency of the MODULATION SIGNAL. For example, referring to FIG. 3, the MODULATION SIGNAL has a duty cycle of approximately 50%. The OFFSET PWM SIGNAL, however, is illustrated to have a duty cycle of less than 50% because the time TA, introduced by the duty cycle controller 60, is significantly less than one-half of the period T. Note the time TA may also be significantly greater than one-half of its period T in other embodiments. A 50% duty cycle modulated signal is also illustrated in FIG. 3.

Figure 4:
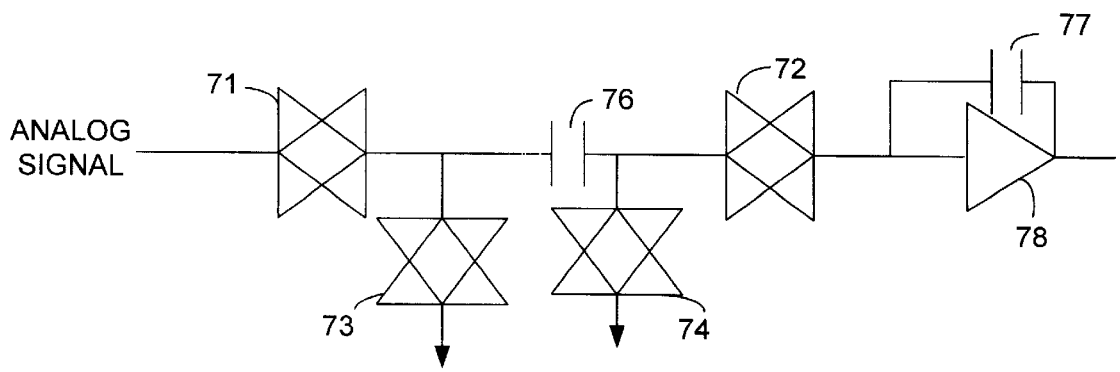
FIG. 4 illustrates, in block diagram form, a portion of the receiver front end of FIG. 1 in greater detail.

FIG. 4 illustrates a portion of the A/D converter 20 in more detail.

Specifically, FIG. 4 illustrates transmission gates 71, 72, 73, and 74, capacitors 76 and 77, and an amplifier 78.

In a specific embodiment, transmission gate 71 has a first node connected to receive the ANALOG SIGNAL from node 11, a second node, and is conductive during the logic level high portion of the OFFSET PWM SIGNAL. Transmission gate 73 has a first node connected to a first voltage reference, a second node connected to the second node of transmission gate 71, and is conductive during the logic level low portion of the OFFSET PWM SIGNAL. Transmission gate 74 has a first node connected to the first voltage reference, a second node, and is conductive during the logic level high portion of the OFFSET PWM SIGNAL. Transmission gate 72 has a first node, a second node, and is conductive during the logic level low portion of the OFFSET PWM SIGNAL. Amplifier 78 has an input node connected to the second node of transmission gate 72, and an output node.

Capacitor 76 has a first node connected to the second node of transmission gate 71, and a second node connected to the first node of transmission gate 72. Capacitor 77 has a first node connected to the input node of the amplifier 78, and a second node connected to the output node of the amplifier 78.

Figure 5:
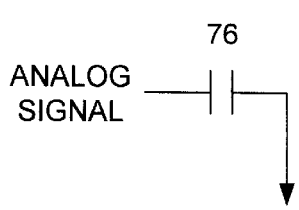
FIG. 5 illustrates, in block diagram form, a portion of FIG. 4 active during first time period.

FIG. 5 illustrates a functional representation of the circuit of FIG. 4 during a logic level high portion of the OFFSET PWM SIGNAL. Specifically, during the logic level high portion of the OFFSET PWM SIGNAL, the transmission gates 72 and 73 are tri-stated, while transmission gates 71 and 74 are conductive. Therefore, the capacitor 76 is charged by the ANALOG SIGNAL during a logic level high portion of the OFFSET PWM SIGNAL. Generally, the duration of the logic level high portion of the OFFSET PWM SIGNAL will be at least approximately 10 times longer than a rise time of the signal charging the capacitor 76, in order to allow for settling time whereby steady-state voltage across capacitor 76 is achieved, hereby the error is substantially negligible.

Figure 6:
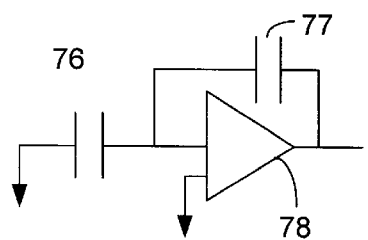
FIG. 6 illustrates, in block diagram form, a portion of FIG. 4 active during a second time period.

FIG. 6 illustrates a functional representation of the circuit of FIG. 4 during a logic level low portion of the OFFSET PWM SIGNAL. Specifically, during the logic level low portion of the OFFSET PWM SIGNAL, the transmission gates 72 and 73 are conductive, while transmission gates 71 and 74 are tri-stated. During this time, integration of the signal stored on capacitor 76, occurs through the amplifier 78 onto capacitor 77. For high-performance, optimal results are achieved when the output voltage slew of the amplifier is limited to approximately 15%, or less, of the integration portion of the PWM signal (logic level low portion). The other 85% of the integration portion of PWM signal allows for linear settling of the amplifier. This is further illustrated in FIG. 7. Note, it will be appreciated that the output voltage slew can be limited to approximately 20%, however, performance degradation may begin to occur due to loss of linearity and other factors.

Figure 7:
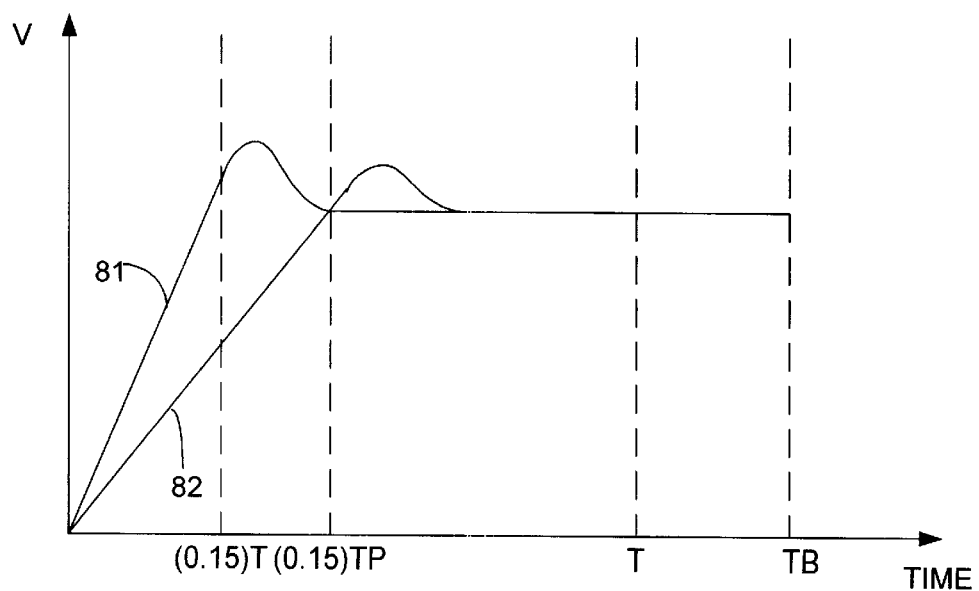
FIG. 7 illustrates, in diagram form, a comparison of voltage waveforms in accordance with the present invention.

FIG. 7 represents the voltage at the integrating capacitor 77 for pulse width modulation signals having different duty cycles. Curve 81 represents a voltage signal received at integrating capacitor 77 based on a PWM signal having a duty cycle of approximately 50% and a period of 2T. The slew rate of a voltage signal 81 occurs between time T0 and (0.15)T, where T is the integration portion of the PWM signal. Line 82 represents the voltage signal 82 received at integrating capacitor 77 based on a PWM signal having a duty cycle of approximately 25% and a period of 2T. The second slew rate of the voltage signal 82 occurs between time to 0 and (0.15)TB, where TB represents the portion of the period 2T which is the integration portion (logic level low portion) of the OFFSET PWM SIGNAL, illustrated in FIG. 3. Note the periods of the modulation signals for curves signals 81 and 82 are substantially similar (2T), however, the integration portion of the period is varied. This allows for more efficient analog-to-digital conversion by reducing the overall power needed, and allowing for higher sampling rates over that of the prior art.

Power savings associated present invention are realized while charging integration capacitor 77. Specifically, the amount power dissipated is defined by the voltage multiplied by the current. The relationship of $I = C dV/dT$ is used determined the minimum amount of current the amplifier must source the minimum required source current from the amplifier is equal to $I = C \cdot SR$, when the slew rate (SR) is substituted into the equation, For a specific embodiment, where the voltage swing on the integrating capacitor is 1 volt (V), the system frequency (fs) is 35.325 MHz, a 50% duty cycle, and the amplifier provides a direct current (DC) that occurs over 15% of the integration period, the slew rate is (1v)/(0.15)(0.5/35.325 MHz), or 471 V/$\mu$sec.

For an expected capacitance of 1.5 pF, the minimum required source current is approximately 700 $\mu$A for a 50% (non-offset) duty cycle. However, maintaining the same variables, and using an offset duty cycle of 25%, where the integrating portion of the offset PWM signal is longer than the sampling portion, the slew rate is reduced to (1v)/(0.15)(0.75/35.325 MHz), or 314 V/$\mu$sec. Substituting into the current equation provides a minimum required source current of 471 $\mu$A. This lower minimum current translates linearly into a lower power dissipation. (i.e. a power savings of approximately 32% when the integration transistor is being charged to a fill one volt. Therefore, based upon the preceding analysis, it can be better understood, how a specific embodiment of the present invention using a 25% duty cycle provides for a power savings over the prior art.

In addition to power savings, the use of an offset PWM signal, as opposed to a 50% duty cycle, allows for a greater sampling frequency. The frequency of a PWM signal having a 50% duty cycle is limited by the longer of the minimum sampling period or the minimum integration period. Generally, the minimum integration period is the longer period because of the settling time associated with the integration amplifier. Therefore, the frequency for a 50% duty cycle PWM is 1/(Tint)*2, where Tint is the minimum integration time period. However, by using an offset PWM signal, the frequency can be chosen to be 1/(Tint+Ts), where Ts is the sampling period. Since Ts is generally smaller than Tint, an increase in sampling frequency is realized.

Figure 8:
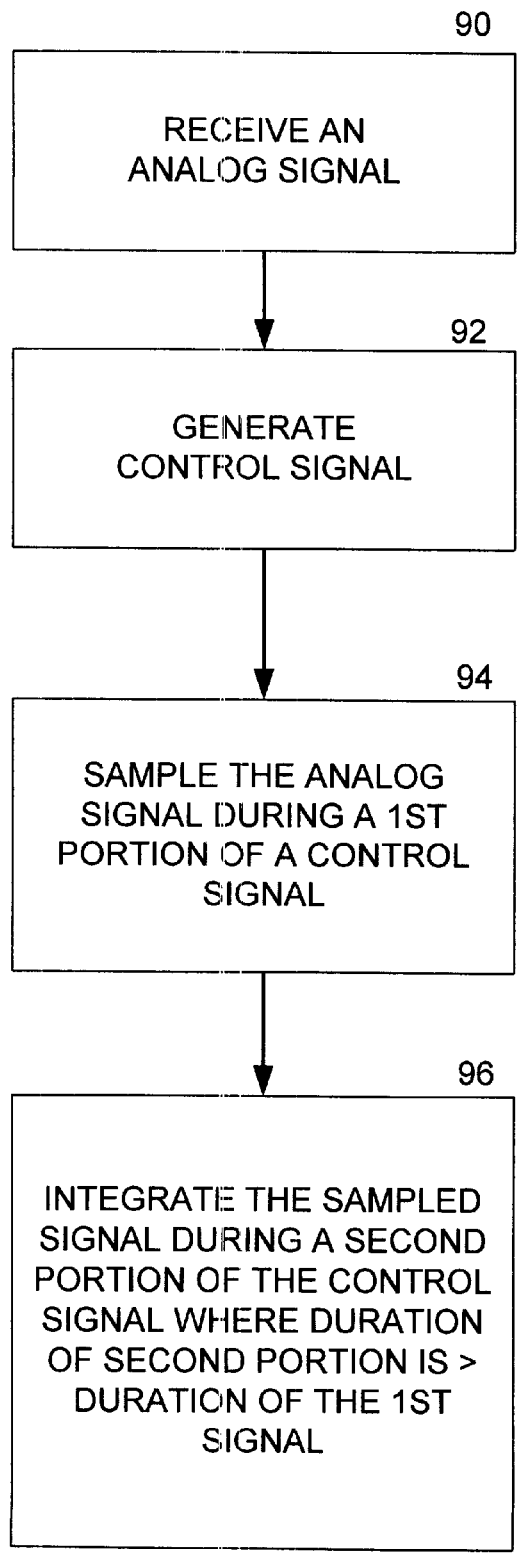
FIGS. 8 and 9 illustrate, in flow diagram form, methods in accordance with the present invention.

FIG. 8 illustrates a method in accordance with the present invention. At step 90 an analog signal is received. The analog signal is analogous to the analog signal received either the input of the automatic gain control portion 10 or the analog signal received at the input of the A-D converter 20 of FIG. 1. In a specific embodiment, the analog signal represents digital data, such as is associated with ADSL. In addition, the analog signal can be received by a portable or handheld system, which will generally operate on batteries.

At step 92 a control signal is generated. The period of the control signal represents the sampling rate of the analog-todigital converter. A first portion of the control signal is referred to as a sampling portion, while a second portion of the control signal is referred to as an integration portion. As previously discussed, the sampling portion of the signal has a duration which can be based upon the slew rate at a sampling capacitor, while the duration of the second portion of the control signal has a duration based upon the slew rate at an integration capacitor. The first and second portion of the control signal can be determined independent of one another based upon system characteristics to arrive at a maximum sampling frequency of the analog-to-digital converter. In a different embodiment, the first and second portion of the control signal can be partitioned based upon a desired sampling frequency of the analog-to-digital converter, and the integrating amplifier designed to support this frequency.

At step 94, the analog signal is sampled during the first portion of the control signal. This is represented in FIG. 5, which illustrates the sampling capacitor 76 being charged.

In At step 96, an integration based upon the sampling signal occurs during the second portion of the control signal. The second portion of the control signal has a longer duration than the first portion of the control signal, allowing the integration amplifier of the analog-to-digital converter to be designed to source a lower amount of current, thereby resulting power savings when the integration capacitor is being charged.

Figure 9:
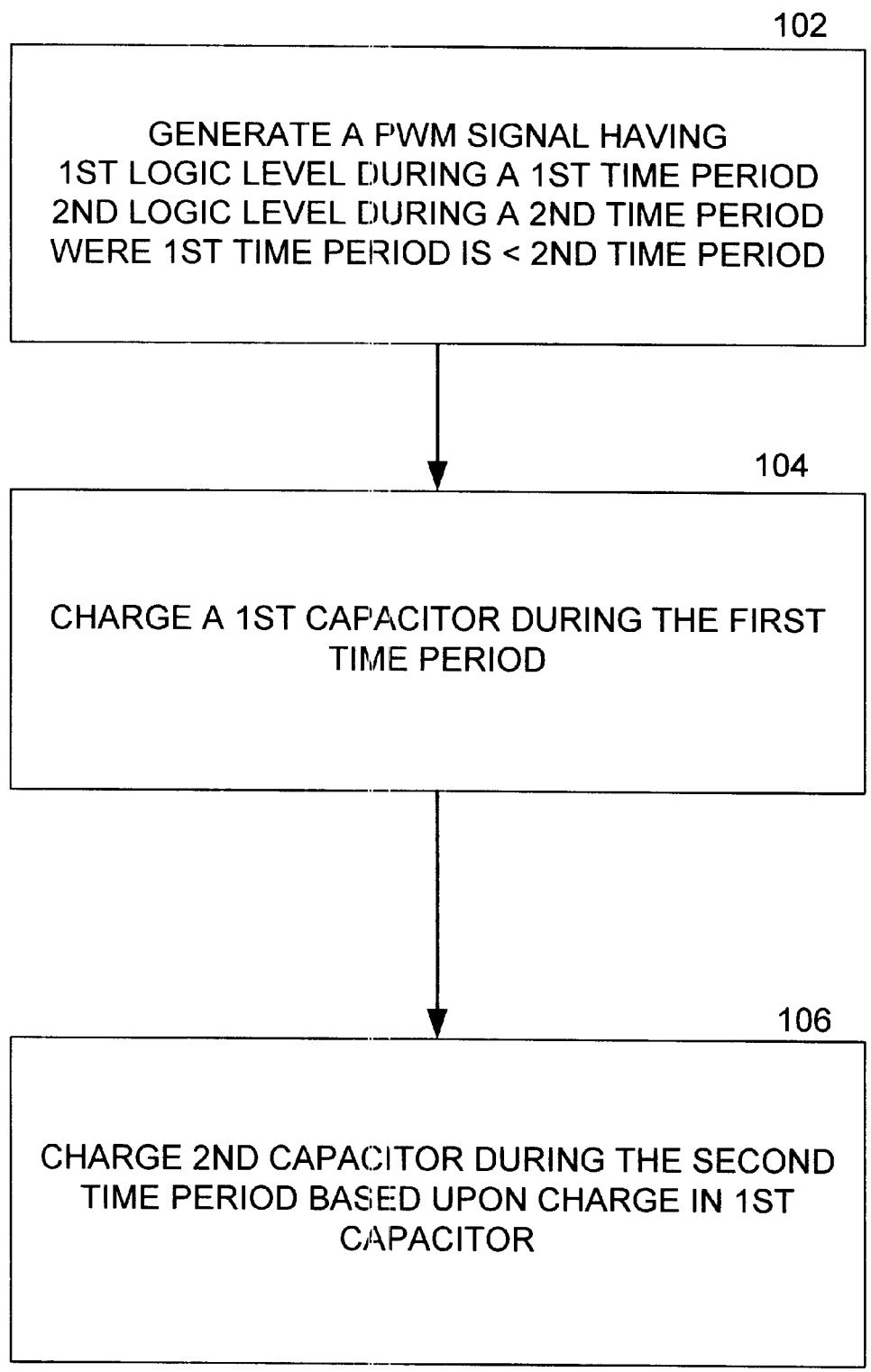

FIG. 9 illustrates another method in accordance with the present invention. At step 102, the PWM signal is generated having a first logic level during a first time period, and a second logic level during a second time period, where the first time period is less than the second time period. Referring to FIG. 3, the first time period is analogous to the time period labeled TA, while the second time period is analogous to time period labeled TB.

At step 104, the first capacitor is charged during the first time period (sampling period). This is analogous to capacitor 76 being charged (FIG. 5) as previously discussed.

At step 106, the second capacitor is charged during a second time (integration period), based upon charged stored in the first capacitor. This is analogous to capacitor 77 (FIG. 6) being charged based upon charge stored in the capacitor 76.

It should now be apparent that the present invention provides advantaged over the prior art. By providing an OFFSET PWM SIGNAL control signal, the amount of power dissipated during an integration cycle of analog-to-digital conversion is reduced. In addition, greater sampling rates are achievable for a given amplifier. It should also be apparent that the present invention has been described with reference to specific embodiments. As such other embodiments are anticipated by the discussions herein. For example, other circuits for generating PWM signals can be implemented. In addition, the specific polarities referenced in the examples herein may vary based upon specific implementations. For example, a system could operate in a low power mode, whereby a specific embodiment of the present invention would be used. The analog to digital converter described herein may be a sigma-delta analog-to-digital converter, or any other type of Sigma Delta converter having a sample cycle followed by an integration cycle. In addition, the present claimed invention may in other applications, such as a switched capacitor circuit, which may be used in a sample and hold circuit, a switch capaciter filter circuit, and sigma-delta analog-to-digital converters.

I claim:

1. A method for sampling analog signals, the method comprising the steps of: receiving an analog signal; sampling the analog signal during a first portion of a control signal to provide a sampled signal; and integrating the sampled signal during a second portion of the control signal, wherein the second portion of the control signal is longer than the first portion of the control signal.

2. The method of claim 1, wherein the step of integrating includes integrating the sampled signal during the second portion of the control signal, wherein the second portion of the control signal is less than or equal to approximately four times longer than the first portion of the control signal.

3. The method of claim 1, wherein the step of receiving further includes receiving an analog signal which represents digital data.

4. The method of claim 1, wherein the step of integrating includes integrating the sampled signal during the second portion of the control signal, wherein the second portion of the control signal is approximately three times longer than the first portion of the control signal.

5. The method of claim 1, wherein the step of receiving further includes receiving the analog signal at a portable device.

6. The method of claim 5, wherein the step of receiving further includes the portable device being battery-operated.

7. The method of claim 5, wherein the step of receiving further includes portable device being the handheld device.

8. The method of claim 1, wherein the step of receiving further includes receiving the analog signal at a device during a low power mode of operation.

9. The method of claim 1, wherein the step of receiving includes receiving the analog signal at an asynchronous digital subscriber line.

10. The method of claim 1, wherein the step of integrating further includes integrating the sampled signal during a second portion of the control signal, wherein a power reduction of greater than approximately 10% is realized as compared to integrating the sampled signal with an alternate control signal having a second portion approximately equal to the first portion, with a control signal and the alternate control signal have approximately the same time period.

11. The method of claim 1, wherein the step of sampling further includes sampling the analog signal during the first portion of the control signal, wherein the first portion of the control signal has a duration based upon a settling time of the sampled signal.

12. The method of claim 1, wherein the step of integrating further includes integrating the sampled signal during the first portion of the control signal, wherein the second portion of control signal has a duration based upon the settling time of an integrating signal.

13. The method of claim 1, wherein a time period of the first portion and the second portion is less than approximately 50 ns.

14. The method of claim 1, wherein a time period of the first portion and second portion is less than approximately 28 ns.

15. The method of claim 1 further comprising the step of: providing a digital representation of an integrated signal, wherein the integrated signal is a result of the step of integrating.

16. The method of claim 1, wherein the sampled signal has a jitter error component of less than approximately 70 ps RMS.

17. A system for sampling analog signals, the system comprising; an analog to digital converter having an analog input, a digital output, and a control input; and a control module having a pulse width modulated output to provide an offset pulse width modulated signal coupled to the control input of the analog to digital converter.

18. The system of claim 17, wherein the control module further includes: a duty cycle controller having an input, and an output, the output coupled to the pulse width modulated Output of the control module, the duty cycle controller to an offset of the offset pulse width modulated signal.

19. The system of claim 18, wherein the duty cycle controller includes a delay element having an input, and an output.

20. The system of claim 19, wherein the output of the delay element is coupled to the first input of a gate, and the input of the delay element is coupled to a second input of the gate.

21. The system of claim 17, wherein the control module further comprising the pulse width modulated output to provide offset pulse width modulated signal having a duty cycle of at least less than approximately 40%.

22. The system of claim 17, wherein the analog to digital converter further comprises a sampling capacitor coupled to the analog input, and integrating capacitor, to the digital output.

23. A method for receiving an analog representation of a digital signal, the method comprising the steps of: generating a pulse width modulated signal having a first logic level at a first time period and a second logic level at a second time period, wherein the first time period is shorter than a second time period; charging a first capacitive element during the first time period; and charging a second capacitive element during the second time period based upon a charge stored on the first capacitive element.

24. Method of claim 23, wherein the step of charging a second capacitive element further includes charging the second capacitive element with a direct current (DC) component during approximately the first 20%, or less, of the second time period.

25. The method of claim 24, wherein the step of generating a pulse width modulated signal further includes the first time being at least approximately 25% shorter than the second time period.

* * * * *